(12) United States Patent
Yagil

(10) Patent No.: US 6,337,642 B1
(45) Date of Patent: Jan. 8, 2002

(54) METHOD FOR EFFICIENT INTERLEAVING OF VARIABLE LENGTH PACKETS WITH MAXIMIZED BLOCK SIZE

(75) Inventor: Ariel Yagil, Ramat Hasharon (IL)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/473,155

(22) Filed: Dec. 28, 1999

(51) Int. Cl.$^7$ ................................................. H03M 7/00
(52) U.S. Cl. .......................................... 341/50; 341/81
(58) Field of Search ............................... 341/50, 51, 81; 370/380, 352, 427, 400; 360/48; 710/11; 382/246; 345/475; 375/240; 715/5, 7, 8, 9

(56) References Cited

U.S. PATENT DOCUMENTS 5,200,864 A * 4/1993 Dunn et al. .................... 360/48
5,623,557 A * 4/1997 Shimoyoshi et al. ........ 382/246
6,043,763 A * 3/2000 Levine ......................... 341/51

* cited by examiner

*Primary Examiner*—Patrick Wamsley
(74) *Attorney, Agent, or Firm*—Frederick J. Telecky, Jr.; Wade James Brady, III; Warren L. Franz

(57) ABSTRACT

A method for efficient interleaving of variable-length packets is provided. In packet networks, block interleaving of variable-length packets can be inefficient when the interleaver block size is fixed and smaller than the packet size. For certain packet lengths, the remaining number of elements for the last block (i.e., bytes or symbols) can be very low. The present invention provides a way to calculate the optimal interleaver block sizes for a preselected packet length and a preselected interleaver width.

10 Claims, 2 Drawing Sheets

US 6,337,642 B1

METHOD FOR EFFICIENT INTERLEAVING OF VARIABLE LENGTH PACKETS WITH MAXIMIZED BLOCK SIZE

TECHNICAL FIELD OF INVENTION

The present invention relates to digital communication channels, and more particularly, to a method for efficient interleaving of variable length packets.

BACKGROUND

In many communication channels, errors appear in bursts, i.e., a single error event has more than one erroneous data element (bit, byte, symbol or other). Error bursts occur because of various reasons, among them burst noise in a channel, error bursts in the output of a Viterbi decoder and others. Error bursts are usually undesirable because most decoders cannot efficiently handle many neighboring errors. An interleaver is a device that allows for the spreading of the error from a burst into separated "single" errors by performing permutations on the data elements. For example, when block coding (such as Reed-Solomon) is used the interleaver allows for spreading of the error burst between a few codewords, thus relaxing the error correction requirements of the code.

A very common and simple interleaver is the block interleaver. In this interleaver, the data elements (bits, bytes, symbols or others) are placed into a two-dimensional table row-wise and are read out of the table column-wise. The block size (i.e., the number of rows multiplied by the number of columns) is typically constrained by the memory resources of the interleaver.

In a packet network, variable-length packets of data are transmitted through a communication channel. The packet size is often greater than the block size. In this case, the packet is divided into segments that are smaller than or equal to the interleaver block size. Each segment is then separately interleaved. A trivial way to perform this segmentation is make all segments but the last one, equal to the interleaver block size. The last segment will then be smaller than the block size. The disadvantage of this method is that the last segment can be very small for certain packet lengths. This results in poor performance of the interleaver.

SUMMARY

The present invention provides a method for efficient interleaving of variable-length packets. In packet networks, block interleaving of variable-length packets can be inefficient when the interleaver block size is fixed and smaller than the packet size. The reason is that for certain packet lengths, the remaining number of elements for the last block (i.e., bytes or symbols) can be very low.

The method of the present invention calculates the optimal interleaver block sizes for a known packet length, which may be variable, and a known (or selected) interleaver width size.

DETAILED DESCRIPTION

An interleaver is a device that allows for the spreading of the error from a burst into separated "single" errors by performing permutations on the data elements in a data packet. For example, when block coding (such as Reed-Solomon) is used the interleaver allows for spreading of the error burst between a few codewords, thus relaxing the error correction requirements of the code.

A very common and simple interleaver is the block interleaver. In this interleaver, the data elements (bits, bytes, symbols or others) are placed into a two-dimensional table row-wise and are read out of the table column-wise. The block size (i.e., the number of rows multiplied by the number of columns) is typically constrained by the memory resources of the interleaver.

In a packet network, variable-length packets of data are transmitted through a communication channel. The packet size is often greater than the block size. In this case, the packet is divided into segments that are smaller than or equal to the interleaver block size. Each segment is then separately interleaved. A trivial way to perform this segmentation is make all segments but the last one, equal to the interleaver block size. The last segment will then be smaller than the block size. The disadvantage of this method is that the last segment can be very small for certain packet lengths. This results in poor performance of the interleaver.

The reason that calculating block sizes is more efficient than just picking a block size and letting the tail (last block) be whatever size it turns out to be is as follows: The burst tolerance of a block (i.e. the longest noise burst that can hit a block and from which data can still be recovered) is T*I bytes, where T is the Reed-Solomon (RS) correction factor, and I is the interleaver depth of the block. The burst tolerance for a packet is determined by its "weakest" block, i.e. the block with the lowest interleaver depth. Therefore, it is desirable that the last block not have a low interleaver depth (possibly 1), and this is achieved by the methods of the present invention.

This invention calculates the sizes of the segments for a data packet, such that the sizes of all segments are nearly equal and still as large as possible. The number of columns is known or fixed, and preferably equals to the codeword length. Formulas are used to calculate the number of rows in each segment as a function of the packet length, codeword length and maximum block size.

Figure 1:
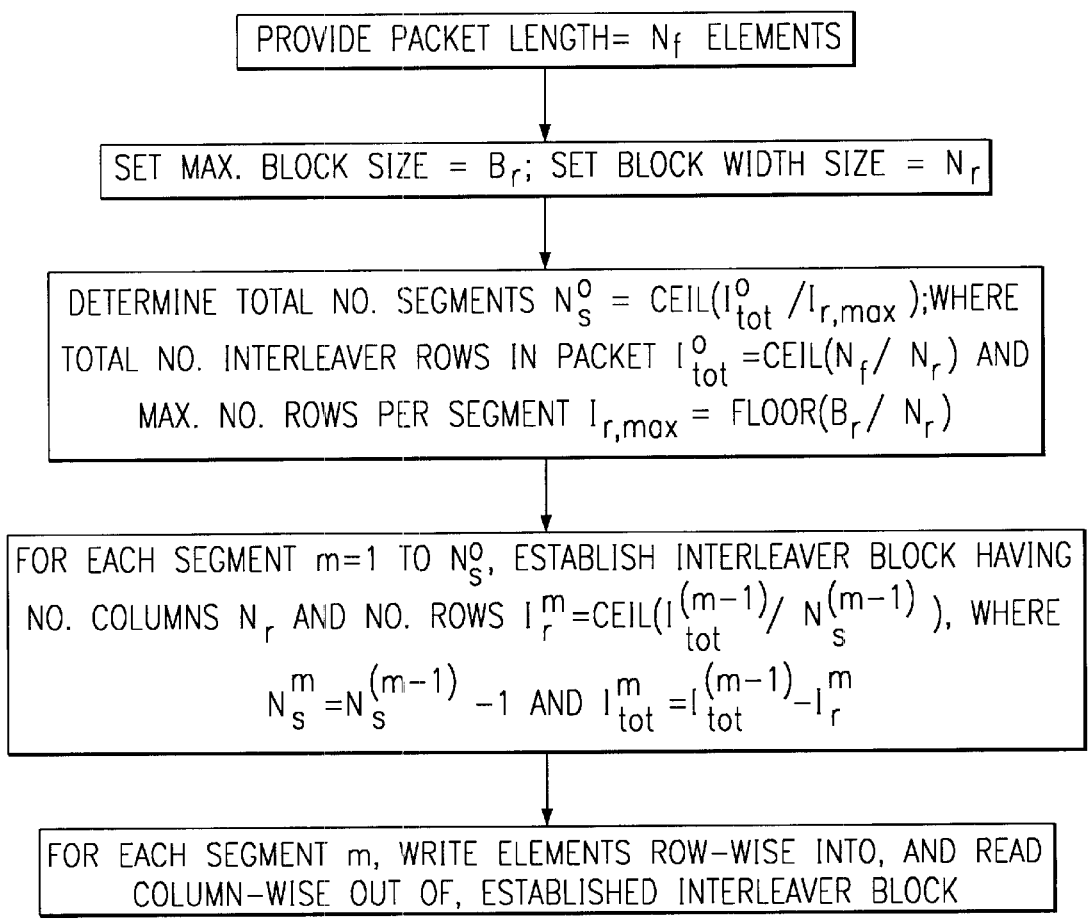
FIGS. 1 and 2 are flow diagrams of described embodiments of the invention.

The present invention provides a simple calculation of optimal interleaver block sizes for a given packet length with the constraint of maximizing the interleaver block size. That is, the present invention provides a method for maximizing burst noise tolerance of a packet by spreading data into approximately equal interleaver blocks rather than having a few fixed size blocks and one small "end" block with a small amount of data (e.g. a low interleaver depth). A first embodiment is shown in FIG. 1.

For the formulas of the present invention, the following notation is used:

Packet length in elements (e.g. bits, bytes, symbols, etc.): $N_f$
Interleaver width (typically codeword length): $N_r$
Maximum block size (in elements): $B_r$
Total number of interleaver rows in the packet: $I_{tot}^0 = \text{ceil}(N_f/N_r)$,
where "ceil(x)" is a function that rounds "x" to the nearest integer in a positive infinity direction.
Maximal number of rows per segment (such that the interleaver block does not exceed $B_r$): $I_{r,max} = \text{floor}(B_r/N_r)$,
where "floor (x)" is a function that rounds "x" to the nearest integer in a negative infinity direction.
Number of segments: $N_s^0 = \text{ceil}(I_{tot}/I_{r,max})$
Then for a segment m, the formula for calculating the maximum number of rows, $I_r^m$ is as (m=1 ... $N_s^0$): follows:

$$I_r^m = \text{ceil}(I_{tot}^{(m-1)} / N_s^{(m-1)})$$

$$N_s^m = N_s^{(m-1)} - 1$$

$$I_{tot}^m = I_{tot}^{(m-1)} - I_r^m$$

An example using this formula is as follows: $N_f$=2100, $N_r$=200, $B_r$=2048

$I_{tot}^0$=ceil($N_f/N_r$)=11
$I_{r,max}$=floor($B_r/N_r$)=10
$N_s^0$=ceil($I_{tot}^0/I_{r,max}$)=2
$I_r^1$=ceil($I_{tot}^0/N_s^0$)=6
$N_s^1 = N_s^0 - 1 = 1$
$I_{tot}^1 = I_{tot}^0 - I_r^1 = 5$
$I_r^2$=ceil($I_{tot}^1/N_s^1$)=5
$N_s^2 = N_s^1 - 1 = 0$
$I_{tot}^2 = I_{tot}^1 - I_r^2 = 0$ For this example, optimal segmentation has been achieved. That is, for this example two blocks each having five rows has been calculated (interleaver depth of five). Although the maximum block size, $B_r$, was selected, these formulas may also be used to optimize the block size, or alternatively, several block sizes may be employed and the one with optimal (maximum) interleaving depth selected for use.

Figure 2:
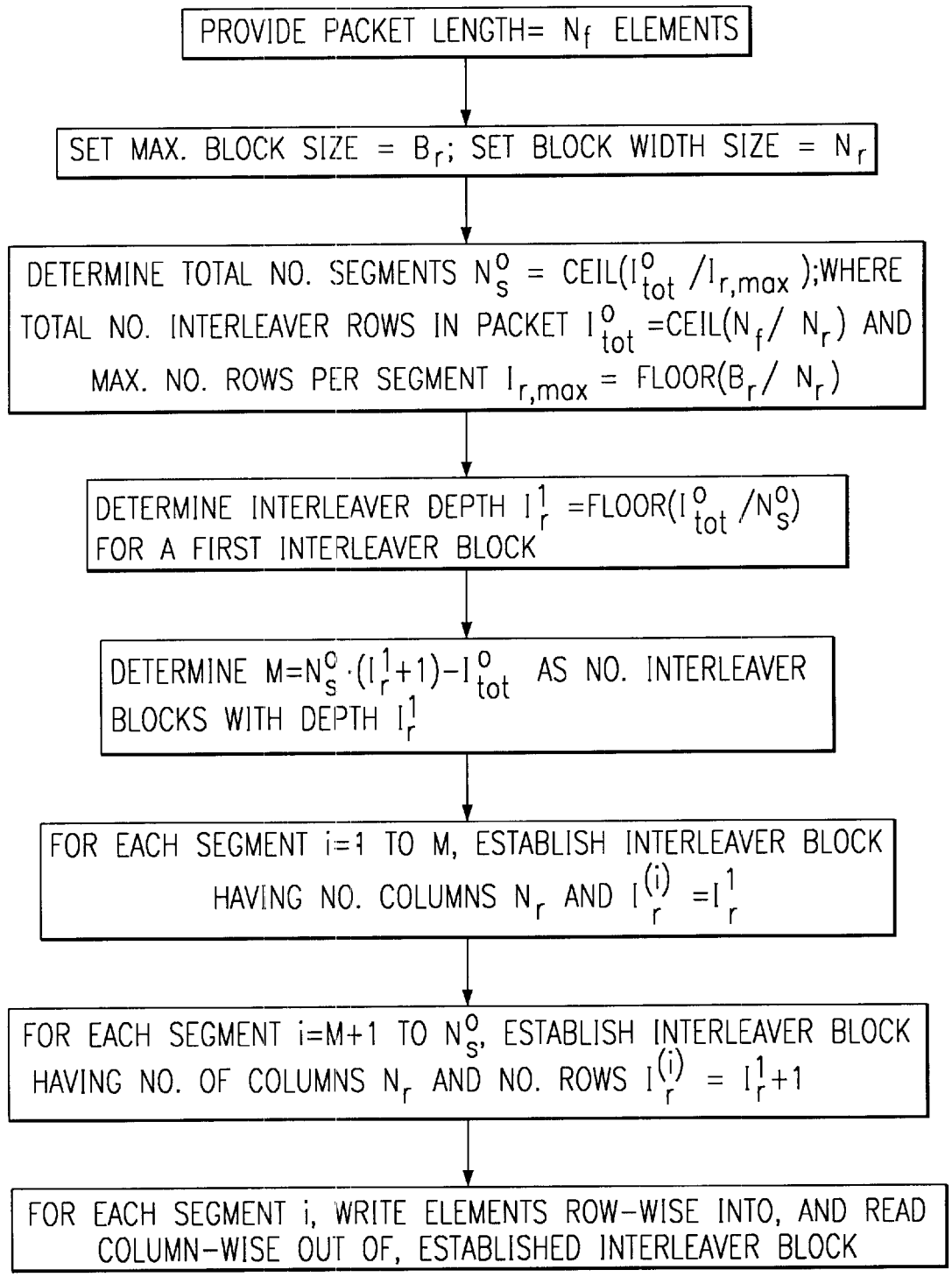

An alternative formula (shown in FIG. 2) may have the following form. This formula results in the same segment sizes, but in a different order.

The prior notation is again used, where:

Packet length: $N_f$
Codeword length: $N_r$
Maximal block size: $B_r$
Total number of interleaver rows: $I_{tot}^0$=ceil($N_f/N_r$)
Maximal number of rows per segment: $I_{r,max}$=floor($B_r/N_r$)
Number of segments: $N_s^0$=ceil($I_{tot}^0/I_{r,max}$)
Interleaver depth of first block: $I_r^1$=floor($I_{tot}^0/N_s^0$)
No. of blocks with depth of $I_r^1$: $M=N_s^0 \cdot (I_r^1+1) - I_{tot}^0$ Then for a segment i, the formula for calculating the maximum number of rows, $I_r^{(i)}$ is as follows: (i=1 ... $N_s^0$):

$$I_r^{(i)} = \begin{cases} I_r^1, & i = 1, \ldots, M \\ I_r^1 + 1, & i = M+1, \ldots, N_s^0 \end{cases}$$

The packet consists of $N_s^0$ interleaver segments (blocks) and the width (number of columns) of each segment is $N_r$. The depth (number of rows) in the first M segments is $I_r^1$. The depth of the rest of the segment is $I_r^1 1$.

An example, using this alternative formula is as follows:

$N_f$=2100, $N_r$=200, $B_r$=2048
$I_{tot}^0$=ceil($N_f/N_r$)=11
$I_{r,max}$=floor($B_r/N_r$)=10
$N_s^0$=ceil($I_{tot}^0/I_{r,max}$)=2
$I_r^1$=floor($I_{tot}^0/N_s^0$)=5
$M=N_s^0 - (I_{tot}^0 - N_s^0 \cdot I_r^1) = 1$ For this example, the results are: $I_r^1$=5, $I_r^2$=6

That is, for this example, two blocks with one having five rows and one having six rows was calculated. Again, optimization on block size may be performed. Other such formula may be generated in a similar fashion to calculate interleaver block sizes for a given packet length while maximizing the block size.

The present invention is capable of being implemented in software, hardware, or combinations of hardware and software. Having thus described in a few particular embodiments of the invention, various alternations, modifications, and improvements will readily occur to those skilled in the art. Such alternations, modifications and improvements as are made obvious by this disclosure are intended to be part of this description though not expressly stated herein, and are intended to be within the spirit and scope of the invention. Accordingly, the foregoing description is by way of example only, and not intended to be limiting. The invention is limited only as defined in the following claims and equivalents thereto.

What is claimed is:

1. A method for interleaving data packets transmitted through a communication channel, the data packets being of variable-lengths greater than a maximum available block size of $B_r$ data elements, comprising the steps of:

designating an interleaver block width size of $N_r$ data elements;

providing a data packet of length $N_f$ data elements;

dividing the packet into $N_s^0$=ceil($I_{tot}^0/I_{r,max}$) segments, where $I_{tot}^0$=ceil($N_f/N_r$) is a total number of interleaver rows in the packet and $I_{r,max}$=floor($B_r/N_r$) is a maximal number of rows per segment such that an interleaver block size does not exceed $B_r$; "ceil(x)" being a function that rounds "x" up to the nearest integer in a positive infinity direction, and "floor (x)" being a function that rounds "x" down to the nearest integer in a negative infinity direction;

establishing, for each segment m, m=1 to $N_s^0$, an interleaver block having a number of columns corresponding to said designated interleaver width size $N_r$ and a number of rows $I_r^m$ equal to, or within one number difference from, the number of rows of all other segments m; and interleaving each segment m, by placing data elements of that segment row-wise into, and reading data elements of that segment column-wise out of, the respective established interleaver block for that segment.

2. A method as in claim 1, wherein the number of rows of said interleaver block size established for each segment m, for m=1 to $N_s^0$, is given by:

determining an interleaver depth $I_r^1$floor($I_{tot}^0/N_s^0$) for a first interleaver block;

determining a number $M=N_s^0 \cdot (I_r^1+1)-I_{tot}^0$ of interleaver blocks with the depth of $I_r^1$;

determining, for each segment i, for i=1 to $N_s^0$, a number of rows $I_r^{(i)}=I_r^1$ for each segment i=1 to M and a number of rows $I_r^{(i)}=I_r^1+1$ for each segment i=M+1 to $I_s^0$; and establishing a number M of $N_s^0$ segment interleaver blocks having a number of rows corresponding to said determined $I_r^1$ number of rows, and a rest of said $N_s^0$ segment interleaver blocks having a number of rows corresponding to said determined $I_r^1+1$ maximum number of rows.

3. A method as in claim 2, wherein said interleaver width size $N_r$ is designated to be equal to a codeword length.

4. A method as in claim 2, wherein said interleaver width size $N_r$ is designated to be equal to a codeword length.

5. A method as in claim 1, wherein the number of rows of said interleaver block size established for each segment m, for m=1 to $N_s^0$, is given by $$I_r^m = \text{ceil}(I_{tot}^{(m-1)} / N_s^{(m-1)}),$$

where $$N_s^m = N_s^{(m-1)} - 1$$

and $$I_{tot}^m = I_{tot}^{(m-1)} - I_r^m.$$

6. A method as in claim 5, wherein said interleaver width size $N_r$ is designated to be equal to a codeword length.

7. A method as in claim 1, wherein said interleaver width size $N_r$ is designated to be equal to a codeword length.

8. A method for establishing sizes of interleaver blocks for segments of a data packet in a packet network wherein variable-length packets of length greater than a maximum available block size are transmitted through a communication channel, comprising the steps of:

providing a packet of length $N_f$ data elements;

designating an interleaver width size of $N_r$ data elements;

designating a maximum block size $B_r$ of data elements;

determining a total number of interleaver rows $I_{tot}^0 = \text{ceil}(N_f/N_r)$ for the packet, where "ceil(x)" is a function that rounds "x" up to the nearest integer in a positive infinity direction;

determining a maximal number of rows per segment $I_{r,max} = \text{floor}(B_r/N_r)$, such that an interleaver block does not exceed $B_r$, where "floor (x)" is a function that rounds "x" down to the nearest integer in a negative infinity direction;

determining a number of segments $N_s^0 = \text{ceil}(I_{tot}^0/I_{r,max})$ for the packet;

determining, for each segment m, for m=1 to $N_s^0$, a maximum number of rows $$I_r^m = \text{ceil}(I_{tot}^{(m-1)} / N_s^{(m-1)});$$

wherein $$N_s^m = N_s^{(m-1)} - 1$$

and $$I_{tot}^m = I_{tot}^{(m-1)} - I_r^m;$$

and establishing, for each said segment m, an interleaver block size having a number of columns corresponding to said designated interleaver width size $N_r$ and a number of rows corresponding to said respective determined maximum number of rows $I_r^m$.

9. A method as in claim 8, wherein said interleaver width size $N_r$ is designated to be equal to a codeword length.

10. A method for establishing sizes of interleaver blocks for segments of a data packet in a packet network wherein variable-length packets of length greater than a maximum block size are transmitted through a communication channel, comprising the steps of:

providing a packet of length $N_f$ data elements;

designating an interleaver width size of $N_r$ data elements;

designating a maximum block size $B_r$ of data elements;

determining a total number of interleaver rows $I_{tot}^0 = \text{ceil}(N_f/N_r)$ for the packet, where "ceil(x)" is a function that rounds "x" up to the nearest integer in a positive infinity direction;

determining a maximal number of rows per segment $I_{r,max} = \text{floor}(B_r/N_r)$, such that an interleaver block does not exceed $B_r$, where "floor (x)" is a function that rounds "x" down to the nearest integer in a negative infinity direction;

determining a number of segments $N_s^0 = \text{ceil}(I_{tot}^0/I_{r,max})$ for the packet;

determining an interleaver depth $I_r^1 = \text{floor}(I_{tot}^0/N_s^0)$ for a first interleaver block;

determining a number $M = N_s^0 \cdot (I_r^1 + 1) - I_{tot}^0$ of interleaver blocks with the depth of $I_r^1$;

determining, for each segment i, for i=1 to $N_s^0$, a number of rows $I_r^{(i)} = I_r^1$ for each segment i=1 to M and a number of rows $I_r^{(i)} = I_r^1 + 1$ for each segment i=M+1 to $N_s^0$; and establishing a number M of $N_s^0$ segment interleaver blocks having a number of columns corresponding to the designated width size and a number of rows corresponding to said determined $I_r^1$ maximum number of rows, and a rest of said $N_s^0$ segment interleaver blocks having a number of columns corresponding to the designated width size and a number of rows corresponding to said determined $I_r^1 + 1$ maximum number of rows.

* * * * *